(12) United States Patent
Ando

(10) Patent No.: US 7,557,396 B2
(45) Date of Patent: Jul. 7, 2009

(54) SEMICONDUCTOR DEVICE AND METHOD OF MANUFACTURING SEMICONDUCTOR DEVICE

(75) Inventor: Atsuhiro Ando, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/358,022

(22) Filed: Feb. 21, 2006

(65) Prior Publication Data
US 2006/0192232 A1 Aug. 31, 2006

(30) Foreign Application Priority Data
Feb. 25, 2005 (JP) ............................ P2005-050213

(51) Int. Cl.
*H01L 21/336* (2006.01)
(52) U.S. Cl. ................. 257/288; 257/401; 257/616; 257/E21.431; 257/E21.433; 438/300
(58) Field of Classification Search ................. 257/19, 257/616, E21.634, 288, E21.431; 438/300
See application file for complete search history.

(56) References Cited

U.S. PATENT DOCUMENTS

| 6,087,235 | A  | * | 7/2000 | Yu .............................. 438/300 |
| 6,797,556 | B2 | * | 9/2004 | Murthy et al. ............... 438/231 |
| 7,195,985 | B2 | * | 3/2007 | Murthy et al. ............... 438/341 |
| 7,479,432 | B2 | * | 1/2009 | Murthy et al. ............... 438/300 |
| 2002/0137269 | A1 | * | 9/2002 | Ping et al. .................... 438/197 |
| 2004/0166611 | A1 | * | 8/2004 | Liu ............................. 438/142 |
| 2004/0169221 | A1 | * | 9/2004 | Ko et al. ...................... 257/330 |

* cited by examiner

*Primary Examiner*—Kenneth A Parker
*Assistant Examiner*—Jose R Diaz
(74) *Attorney, Agent, or Firm*—Sonnenschein Nath & Rosenthal LLP

(57) ABSTRACT

A semiconductor device includes a side wall spacer formed on the side surface of a gate electrode formed on the upper side of a semiconductor substrate with a gate insulation film therebetween, extension regions built up on the semiconductor substrate, and source/drain regions formed on the extension regions, wherein a first epitaxial layer is formed so as to fill up portions, cut out at the time of forming the side wall spacer, of the semiconductor substrate, and the extension regions are formed on the first epitaxial layer from a second epitaxial layer of a conduction type opposite to that of the first epitaxial layer.

4 Claims, 4 Drawing Sheets

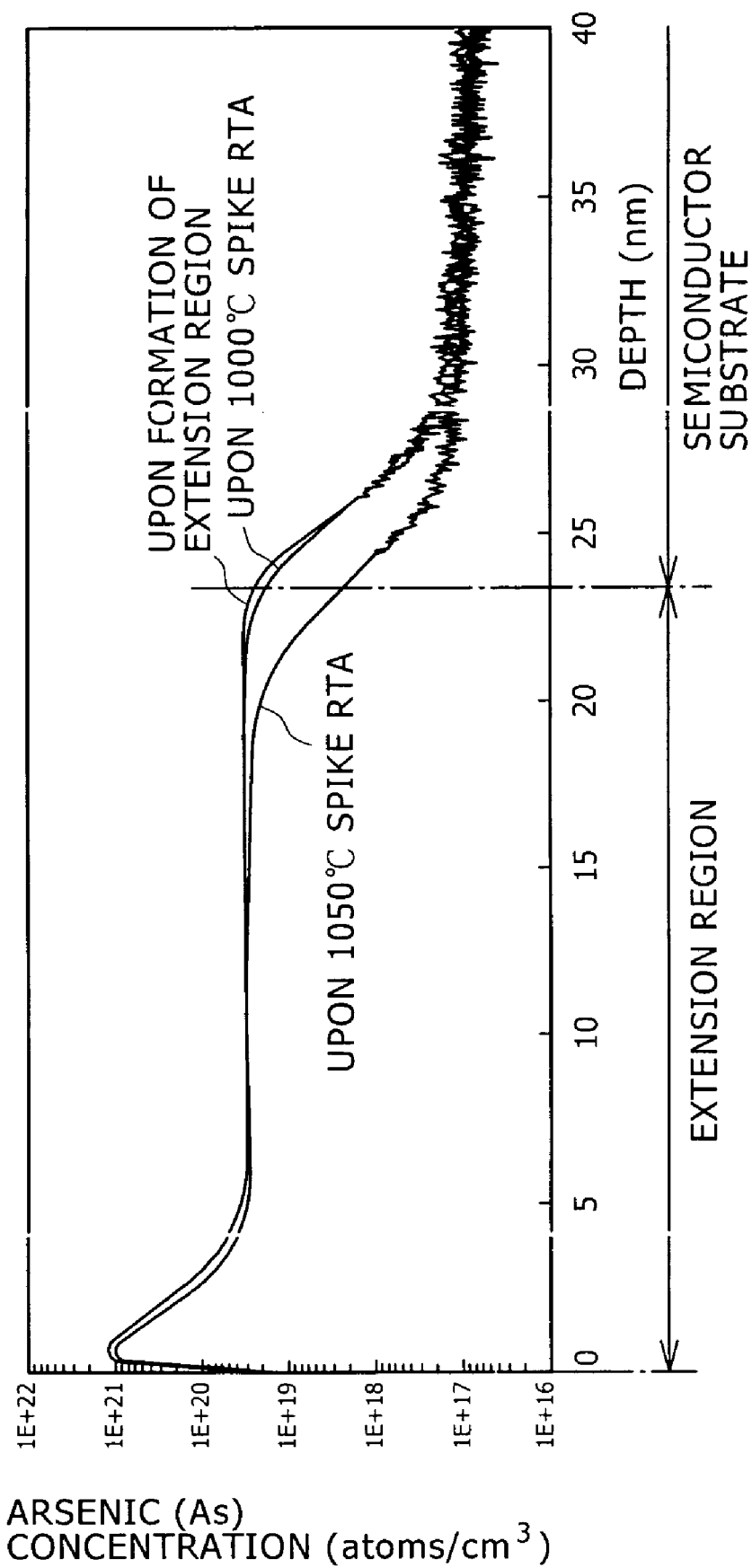

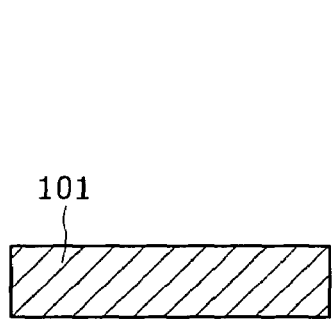 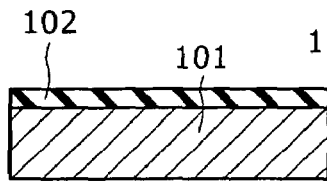 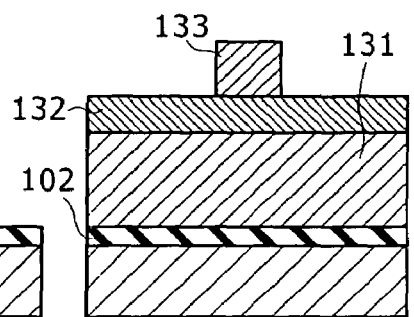
FIG.3A   FIG.3B   FIG.3C
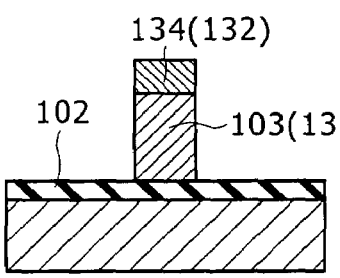 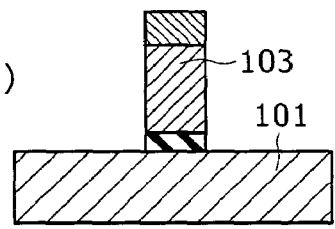 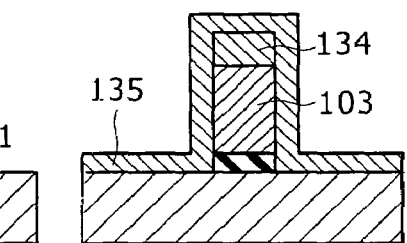
FIG.3D   FIG.3E   FIG.3F
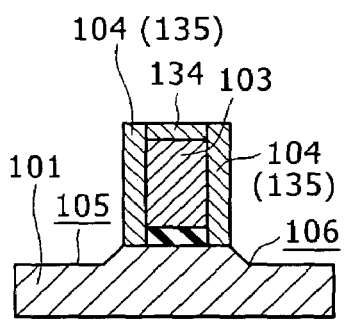 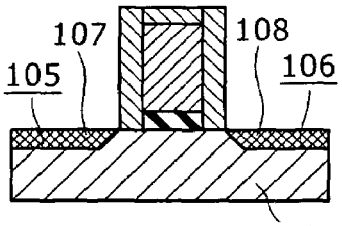 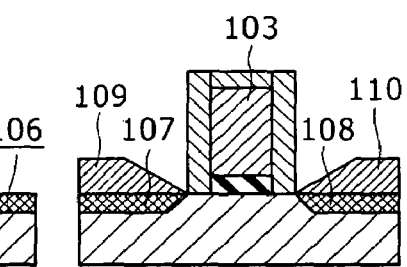
FIG.3G   FIG.3H   FIG.3I

SEMICONDUCTOR DEVICE AND METHOD OF MANUFACTURING SEMICONDUCTOR DEVICE

CROSS REFERENCES TO RELATED APPLICATIONS

The present invention contains subject matter related to Japanese Patent Application JP 2005-050213 filed in the Japanese Patent Office on Feb. 25, 2005, the entire contents of which being incorporated herein by reference.

BACKGROUND OF THE INVENTION

The present invention relates to a semiconductor device and a method of manufacturing a semiconductor device such that it is easy to reduce the short channel effect.

As a structure for reducing the short channel effect in a CMOS transistor, there have been proposed many elevated source/drain structures (see, for example, Japanese Patent Laid-Open Nos. 2004-95639, 2004-152973, and 2002-231942). In the structures described in the just-mentioned parent references, formation of an extension portion above the surface of a semiconductor substrate is disclosed, for suppressing the short channel effect. In other configurations than those using a polycrystalline silicon (see, for example, Japanese Patent Laid-Open No. 2002-26310), it may be necessary to form a silicon nitride film on a gate electrode side wall, for restraining growth of silicon onto the gate electrode at the time of epitaxial growth. It is easily understood that it is important to form the silicon nitride film on only the gate electrode side wall, and silicon nitride left on the silicon substrate, if any, would cause defects to be generated at the time of forming the extension portion.

In the dry etching technique used generally, it is extremely difficult to remove a silicon nitride film present on a silicon substrate without etching the silicon substrate, and the silicon substrate is found cut out by about 2 to 5 nm upon the processing of the silicon nitride film. When the epitaxial growth is conducted without taking into account the recess in the silicon substrate generated after the formation of a side wall spacer of silicon nitride which would be necessary at the time of the epitaxial growth, it may be impossible to provide the extension portion on the silicon substrate as intended. This would make it practically impossible to restrain the short channel effect as originally intended.

SUMMARY OF THE INVENTION

Thus, there is a need to solve the problem that, in the case of forming a side wall spacer of a silicon nitride film on only the side wall of a gate electrode on a silicon substrate, the silicon substrate would be cut out so as to make it difficult to form an elevated source/drain structure above the surface of the silicon substrate, which makes it difficult to suppress the short channel effect.

According to one embodiment of the present invention, there is provided a semiconductor device including: a gate electrode formed on the upper side of a semiconductor substrate, with a gate insulation film therebetween; a side wall spacer formed on a side wall of the gate electrode; extension regions built up on the semiconductor substrate on both sides of the gate electrode; and source/drain regions formed on the extension regions; wherein the semiconductor device includes: a first epitaxial layer so formed as to fill up a portion, cut out at the time of forming the side wall spacer, of the semiconductor substrate; and the extension regions including a second epitaxial layer which is of a conduction type opposite to the conduction type of the first epitaxial layer and which is formed on the first epitaxial layer.

According to another embodiment of the present invention, there is provided a method of manufacturing a semiconductor device, including the steps of: forming a gate electrode on the upper side of a semiconductor substrate, with a gate insulation film therebetween; forming a side wall spacer on a side surface of the gate electrode; forming extension regions on the semiconductor substrate on both sides of the gate electrode; and forming source/drain regions on the extension regions, wherein the method includes the steps of: forming a first epitaxial layer so as to fill up a portion, cut out at the time of forming the side wall spacer, of the semiconductor substrate; and forming the extension regions including a second epitaxial layer of a conduction type opposite to the conduction type of the first epitaxial layer, on the first epitaxial layer.

In the semiconductor device according the one embodiment of the present invention, the first epitaxial layer is so formed as to fill up the portion, cut out at the time of forming the side wall spacer, of the semiconductor substrate. Therefore, when the first epitaxial layer is formed to have an impurity concentration comparable to that of the semiconductor substrate, the semiconductor substrate is substantially restored into the state before being cut out, or the first epitaxial layer is formed to be above the surface of the semiconductor substrate. Besides, since the extension regions including the second epitaxial layer which is of a conduction type opposite to that of the first epitaxial layer and which is formed on the first epitaxial layer are provided, the extension regions are formed to be flush with the surface of the semiconductor substrate or to be above the surface, so that the short channel effect can be restrained.

The method of manufacturing a semiconductor device according to the another embodiment of the present invention includes the step of forming a first epitaxial layer so as to fill up the portion, cut out at the time of forming a side wall spacer, of a semiconductor substrate, so that the cut-out portion of the semiconductor substrate is filled up with the first epitaxial layer. In addition, when the first epitaxial layer is formed to have an impurity concentration comparable to that of the semiconductor substrate, the semiconductor substrate can be substantially restored into the state before being cut out, or the first epitaxial layer can be formed to be above the surface of the semiconductor substrate. Besides, since the manufacturing method includes the step of forming the extension regions including the second epitaxial layer which is of a conduction type opposite to that of the first epitaxial layer and which is formed on the first epitaxial layer, the extension regions are formed to be flush with the surface of the semiconductor substrate or to be above the surface, so that the short channel effect can be restrained.

BRIEF DESCRIPTION OF THE DRAWINGS

FIG. 2 is a diagram showing the impurity concentration profile from an extension region toward a semiconductor substrate, in the semiconductor device according to the present invention;

FIGS. 3A to 3I are manufacturing step sectional diagrams illustrating an example of the method of manufacturing a semiconductor device according to another embodiment of the present invention; and FIGS. 4A to 4H are manufacturing step sectional diagrams illustrating the manufacturing method, from the step of forming source/drain regions on.

DETAILED DESCRIPTION OF THE PREFERRED EMBODIMENTS

The need to restrain the short channel effect has been fulfilled by providing a first epitaxial layer so formed as to fill up the portion, cut out at the time of forming a side wall spacer, of a semiconductor substrate, and extension regions including a second epitaxial layer which is of a conduction type opposite to that of the first epitaxial layer and which is formed on the first epitaxial layer.

EXAMPLE 1

An example of the semiconductor device according to an embodiment of the present invention will be described referring to the schematic configuration sectional diagram shown in FIG. 1.

Figure 1:
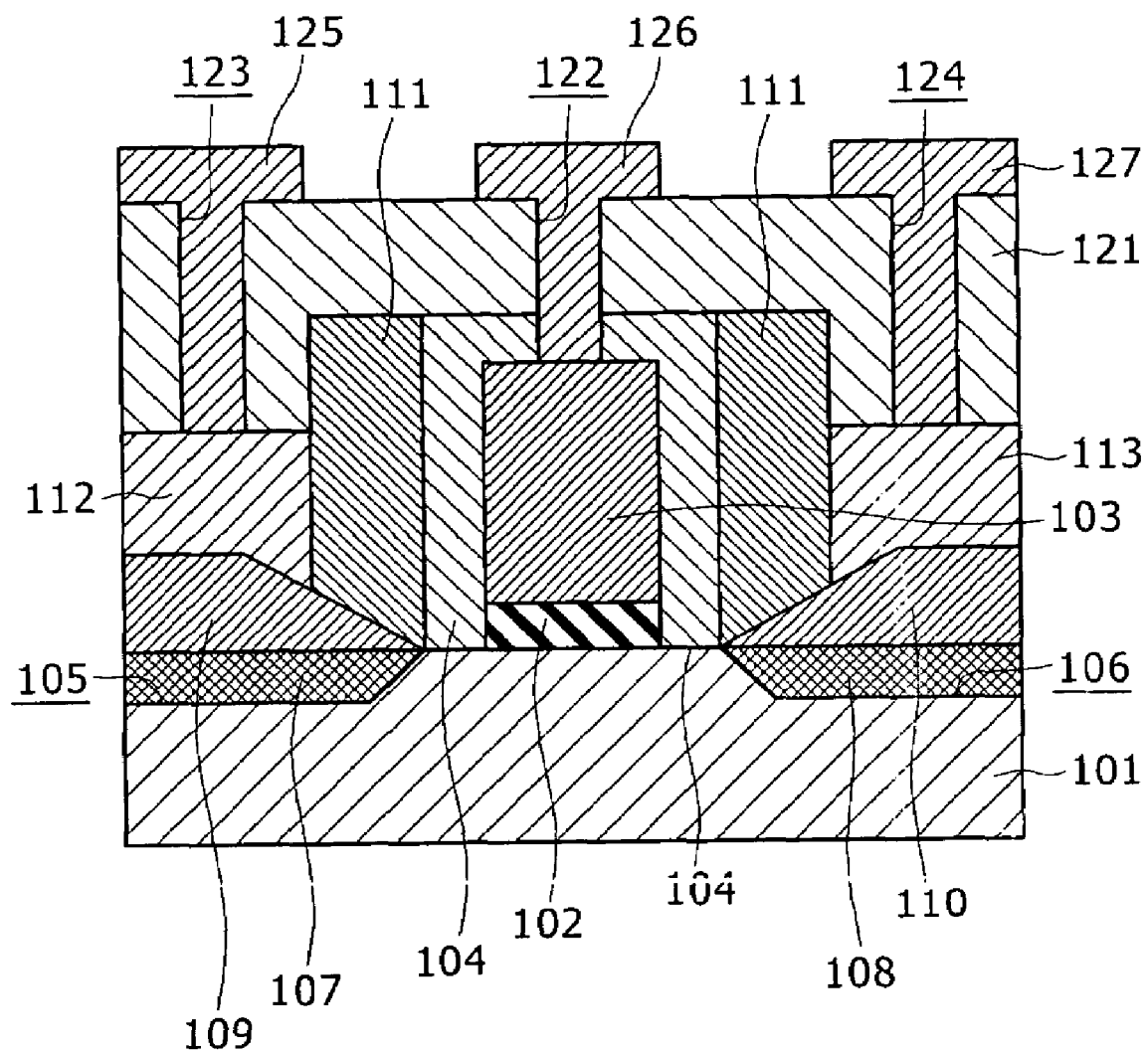
FIG. 1 is a schematic configuration sectional diagram showing an example of the semiconductor device according to an embodiment of the present invention.

As shown in FIG. 1, a gate electrode 103 is formed on the upper side of a semiconductor substrate 101, with a gate insulation film 102 therebetween. A silicon substrate is used as the semiconductor substrate 101. As the semiconductor substrate 101, other substrates than the silicon substrate can also be used, for example, an SOI (Silicon on Insulator) substrate. The gate insulation film 102 can be composed of a silicon oxide film formed by a thermal oxidation process, for example, or can be composed of any of the dielectric films ordinarily used as a gate insulation film in MOS type transistors. The gate electrode 103 can be formed of polysilicon, for example.

A side wall spacer 104 is formed on the side wall of the gate electrode 103. The side wall spacer 104 is composed of a silicon nitride film, for example. Alternatively, the side wall spacer 104 may be composed of a silicon oxide film. The side wall spacer 104 functions also to prevent silicon from being grown on the gate electrode 103 at the time of epitaxial growth. A first epitaxial layer 107, 108 is formed so as to fill up recesses 105, 106, cut out at the time of forming the side wall spacer 104, of the semiconductor substrate 101. The first epitaxial layer 107, 108 is preferably formed to have an impurity concentration comparable to the impurity concentration of the semiconductor substrate 101. For example, the first epitaxial layer 107, 108 is doped with an impurity by in-situ doping at the time of the epitaxial growth.

Extension regions 109, 110 composed of a second epitaxial layer of a conduction type opposite to that of the first epitaxial layer 107, 108 are formed on the first epitaxial layer 107, 108. The extension regions 109, 110 are doped with an impurity by in-situ doping at the time of epitaxial growth. Besides, the extension regions 109, 110 are desirably so formed as to have slant regions which become smaller in film thickness as the gate electrode 103 is approached, for the purpose of reducing the electrical coupling capacity with the gate electrode 103.

Further, side walls 111 are formed on both sides of the gate electrode 103, with the side wall spacer 104 therebetween. Source/drain regions 112, 113 are formed on the extension regions 109, 110. The source/drain regions 112, 113 are formed by epitaxial growth, for example, and are doped with an impurity by in-situ doping at the time of epitaxial growth.

A layer insulation film 121 is formed so as to cover the source/drain regions 112, 113, the side walls 111 and the like. The layer insulation film 121 is composed of a silicon oxide film formed by high-density plasma CVD, for example. In addition, the surface of the layer insulation film 121 is flattened by chemical mechanical polishing (CMP), for example.

The layer insulation film 121 is provided with a contact hole 122 reaching the gate electrode 103, and contact holes 123, 124 reaching the source/drain regions 112, 113, respectively; besides, a wiring 126 connected to the gate electrode 103 through the contact hole 122 and wirings 125, 127 connected to the source/drain regions 112, 113 through the contact holes 123, 124 are formed.

In the semiconductor device 1, the first epitaxial layer 107, 108 is so formed as to fill up the portions, cut out at the time of forming the side wall spacer 104, of the semiconductor substrate 101, i.e., the recesses 105, 106 in the semiconductor substrate 101. Therefore, when the first epitaxial layer 107, 108 is formed to have an impurity concentration comparable to that of the semiconductor substrate 101, the semiconductor substrate 101 is restored into the state before being cut out, or the first epitaxial layer 107, 108 is formed to have a surface above the surface of the semiconductor substrate 101. Since the extension regions 109, 110 composed of the second epitaxial layer which is of a conduction type opposite to that of the first epitaxial layer 107, 108 are formed on the first epitaxial layer 107, 108, the extension regions 109, 110 are formed to have surfaces flush with or above the surface of the semiconductor substrate 101, so that the short channel effect can be restrained.

Now, the results of examination of impurity concentration distribution by secondary-ion mass spectrometry (SIMS) in the direction of from the extension region 110 toward the substrate 101 (depth direction) will be described referring to the diagram showing the relationship between arsenic (As) concentration and depth in FIG. 2.

As shown in FIG. 2, the arsenic (As) concentration in the extension region 110 upon the formation of the extension regions 109, 110 was $3 \times 10^{19}$ atoms/cm$^3$, and the arsenic (As) concentration in the substrate 101 at that instance was $1 \times 10^{17}$ atoms/cm$^3$. Upon spike RTA (Rapid Thermal Annealing) conducted thereafter at 1050° C., the arsenic (As) concentration in the extension region 110 was $2.83 \times 10^{19}$ atoms/cm$^3$. Or, upon spike RTA at 1000° C., the arsenic (As) concentration in the extension region 110 was $3.09 \times 10^{19}$ atoms/cm$^3$. Thus, it can be confirmed that the impurity concentration in the extension regions 109, 110 is little changed even when the spike RTS is conducted, and a lowering in impurity concentration is observed only in the vicinity of the interface between the extension regions 109, 110 and the first epitaxial layer 107, 108, so that the extension regions 109, 110 are not largely extended toward the substrate 101. Therefore, even upon the heat treatment after the formation of the extension regions 109, 110, the extension regions 109, 110 are formed to be flush with or above the surface of the substrate 101, so that the short channel effect can be restrained.

EXAMPLE 2

An example of the method of manufacturing a semiconductor device according to another embodiment of the present invention will be described referring to the manufacturing step sectional diagrams shown in FIGS. 3A to 3I.

As shown in FIG. 3A, a silicon substrate is used as a semiconductor substrate 101. As the semiconductor substrate 101, other substrates than the silicon substrate can also be used, for example, an SOI (Silicon on Insulator) substrate.

Next, as shown in FIG. 3B, a gate insulation film 102 is formed on the surface of the semiconductor substrate 101. The gate insulation film 102 can be formed by a thermal oxidation process, for example; here, as an example, the gate insulation film 102 was formed by oxidizing the surface of the semiconductor substrate 101.

Subsequently, as shown in FIG. 3C, a gate electrode forming film 131 and a hard mask layer 132 to be an etching mask at the timing etching the gate electrode forming film 131 are sequentially formed on the gate insulation film 102. The gate electrode forming film 131 can be formed of polysilicon, for example, and the hard mask layer 132 can be formed of silicon nitride, for example. As the film forming method in these cases, there can be adopted a Chemical Vapor Deposition (CVD) process, for example. Te hard mask layer 132 formed of silicon nitride will be used also as a film for restraining growth of silicon onto the gate electrode at the later step of epitaxial growth of silicon. Other than the silicon nitride film, a silicon oxide film may also be used as the hard mask layer 132, whereby the same effect can be obtained. Besides, other than polysilicon, amorphous silicon may also be used to form the gate electrode forming film 131, whereby the same effect can be obtained.

Thereafter, a resist film is formed by a resist coating technique, and then the resist film is patterned into a gate electrode pattern shape by lithographic technique, to form a resist pattern 133. A bottom anti-reflection coat (Barc) may also be used as a lower layer structure of the resist pattern 133, whereby the same effect can be obtained. In this case, etching (e.g., reactive ion etching) for processing the Barc before processing silicon nitride as will be shown below may be needed.

Next, as shown in FIG. 3D, using the resist pattern 133 [see FIG. 3C] as an etching mask, the hard mask layer 132 and the gate electrode forming film 131 are etched, to form a hard mask 134 and a gate electrode 103. In this case, the etching of the gate electrode forming film 131 is stopped at the upper surface of the gate insulation film 102 therebeneath. Thereafter, the resist pattern 133 left after the processing of the gate electrode forming film 131 is removed by an ashing treatment using mainly oxygen.

Subsequently, as shown in FIG. 3E, a liquid chemical treatment using a fluoric acid-containing liquid chemical is carried out for removing reaction products formed on side surfaces of the gate electrode 103. By the liquid chemical treatment, the gate insulation film 102 [see FIG. 3D] being exposed is exfoliated, with the result that the semiconductor substrate 101 is exposed.

Next, as shown in FIG. 3F, a side wall spacer forming film 135 is formed so as to cover the gate electrode 103 and the hard mask 134. The side wall spacer forming film 135 functions also to prevent growth of silicon on the gate electrode 103 at the time of epitaxial growth which will be conducted later. The side wall spacer forming film 135 can be composed, for example, of a silicon nitride film by, for example, chemical vapor deposition. The side wall spacer forming film 135 is preferably composed of a silicon nitride film because it is destined to serve as a film for restraining epitaxial growth; however, a silicon oxide film, a silicon oxynitride film and the like may also be used, whereby the same effect can be obtained.

Subsequently, as shown in FIG. 3G, the side wall spacer forming film 135 is etched by reactive ion etching (RIE), to form a side wall spacer 104 on the side walls of the gate electrode 103. In the reactive ion etching, for example, a fluorocarbon-based gas can be used.

In the reactive ion etching, the side wall spacer forming film 135 on the semiconductor substrate 101 can be removed, leaving the side wail spacer forming film 135 on the side walls of the gate electrode 103. In this case, it is important that the hard mask 134 is left on the gate electrode 103, as a film which will function as a restraining film at the time of epitaxial growth. In the etching, the semiconductor substrate 101 is also etched simultaneously with the side wall spacer forming film 135, resulting in the generation of recesses 105, 106 on both sides of the gate electrode 103. Thereafter, the fluorocarbon polymer is removed by an ashing treatment using mainly oxygen. This step may be incorporated into a cleaning treatment which will be conducted later by use of a liquid chemical.

Next, as shown in FIG. 3H, a first epitaxial layer 107, 108 is epitaxially grown so as to fill up the recesses 105, 106 formed due to cutting-out of the semiconductor substrate 101. The formation of the first epitaxial layer 107, 108 is conducted, for example, by a method in which silicon is epitaxially grown on the surface of the semiconductor substrate (silicon substrate) 101 so that the surface of the first epitaxial layer 107, 108 is at substantially the same level as the surface of the semiconductor substrate 101 before the formation of the recesses 105, 106. The impurity concentration in the first epitaxial layer 107, 108 in this case is desirably comparable to that of the semiconductor substrate 101; however, in the case where thermal diffusion of the impurity from the extension regions to be formed in the next step is generated due to the subsequent heat treatment, the impurity concentration in the first epitaxial layer 107, 108 is desirably set at a value determined taking the thermal diffusion into account. Besides, the impurity can be introduced by in-situ doping at the time of the epitaxial growth of the first epitaxial layer 107, 108. Further, the epitaxial growth is desirably conducted according to the shape (angle) of the recesses 105, 106 generated in the semiconductor substrate 101.

Before the formation of the first epitaxial layer 107, 108, preferably, a liquid chemical treatment is carried out for adjusting the tapered surfaces of the recesses 105, 106 in the semiconductor substrate 101 to the crystal orientation of the semiconductor substrate. Methods which can be used for the liquid chemical treatment include a method in which aqueous ammonia-hydrogen peroxide ($NH_4OH:H_2O_2:H_2O=1:2:40$) is used, a method in which aqueous hydrochloric acid-hydrogen peroxide ($HCl:H_2O_2:H_2O=1:2:40$) is used, and a method in which aqueous hydrogen peroxide ($H_2O_2:H_2O=1:0$ to $1$) is used to oxidize the surface to a depth of about 2 nm and thereafter the oxide film is removed by use of 0.5 to 1.0% hydrofluoric acid. In the methods in which aqueous ammonia-hydrogen peroxide and aqueous hydrochloric acid-hydrogen peroxide are used respectively, the liquid temperature is set to 40° C., for example. In the method in which aqueous hydrogen peroxide and hydrofluoric acid are used, the temperatures of both liquids are set to 25° C., for example. By the above-mentioned treatment, the tapered surfaces of the recesses 105, 106 can be adjusted to the crystal orientation of the semiconductor substrate 101.

Next, as shown in FIG. 3I, a second epitaxial layer having a desired impurity concentration and a desired film thickness is formed on the first epitaxial layer 107, 108, to form extension regions 109, 110. The extension regions 109, 110 are desirably so made to become smaller in film thickness as the gate electrode 103 is approached, for reducing the electrical coupling capacity with the gate electrode 103. In addition, the extension regions 109, 110 can be doped with the impurity by in-situ doping at the time of epitaxial growth of the second epitaxial layer.

Thereafter, formation of a side wall, formation of source/drain regions, reduction of electric resistance in siliciding by use of cobalt, nickel or the like, formation of contacts to electrodes, formation of wirings, etc. are conducted by known technologies, and mounting is conducted, to complete a semiconductor device.

Now, the steps up to the step of forming the wirings will be described below referring to the manufacturing step sectional diagrams shown in FIGS. 4A to 4H.

Figure 4A:
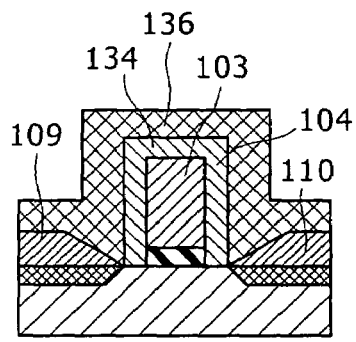

As shown in FIG. 4A, a side wall forming film 136 covering the gate electrode 103, the hard mask 134, the side wall spacer 104, the extension regions 109, 110 and the like is formed. The side wall forming film 136 can be composed of a silicon nitride film, for example.

Figure 4B:
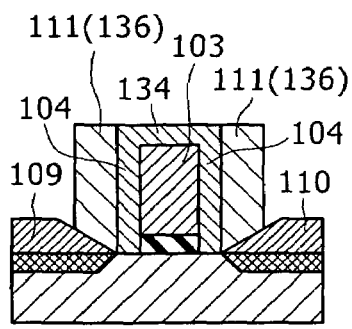

Next, as shown in FIG. 4B, the side wall forming film 136 is etched, to thereby form a side wall 111 over the side wall of the gate electrode 103, with the side wall spacer 104 therebetween. In this case, the side wall forming film 136 on the extension regions 109, 110 is removed by an etch-back treatment, whereby the extension regions 109, 110 are exposed. Besides, since the hard mask 134 composed of the silicon nitride film is formed on the gate electrode 103, the silicon nitride film of the hard mask 134 is left on the gate electrode 103. Reactive ion etching, for example, can be used for the etch-back treatment.

Figure 4C:
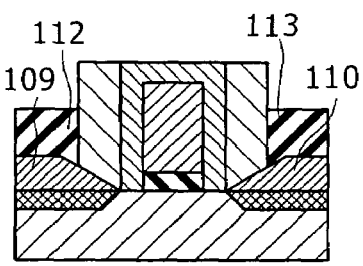

Subsequently, as shown in FIG. 4C, source/drain regions 112, 113 are selectively formed on the extension regions 109, 110 by a selective epitaxial growth method. The source/drain regions 112, 113 can be doped with an impurity by in-situ doping at the time of the epitaxial growth.

Figure 4D:
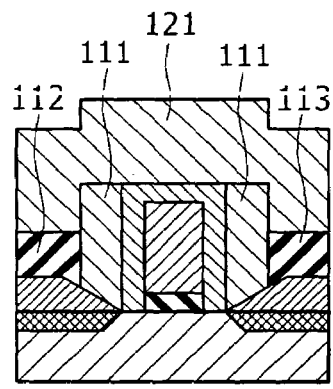

Next, as shown in FIG. 4D, a layer insulation film 121 is formed so as to cover the source/drain regions 112, 113, the side wall 111 and the like. The layer insulation film 121 can be composed of a silicon oxide film by high-density plasma CVD, for example.

Figure 4E:
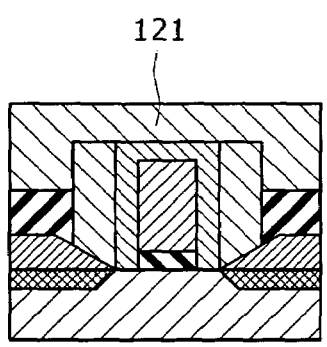

Subsequently, as shown in FIG. 4E, the surface of the layer insulation film 121 is flattened by chemical mechanical polishing (CMP).

Figure 4F:
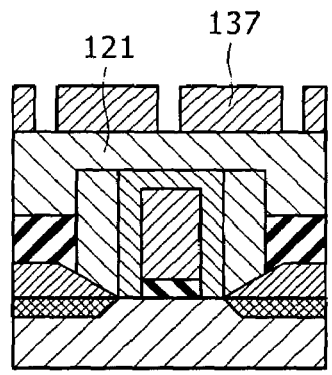

Next, as shown in FIG. 4F, an etching mask 137 to be used in forming contact holes is formed from a resist on the surface of the layer insulation film 121 by a resist coating technique, lithography and the like.

Figure 4G:
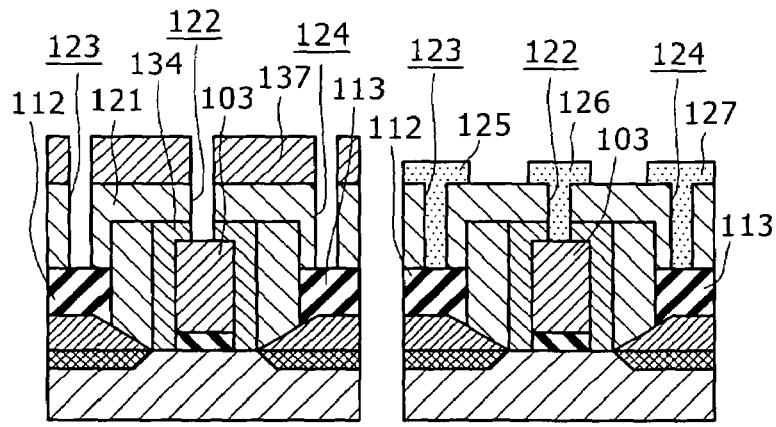

Subsequently, as shown in FIG. 4G, the layer insulation film 121, the hard mask 134 and the like are etched while using the etching mask 137, to form a contact hole 122 reaching the gate electrode 103 and contact holes 123, 124 reaching the source/drain regions 112, 113, respectively. Thereafter, the etching mask 137 is removed by a resist ashing treatment using mainly oxygen.

Figure 4H:
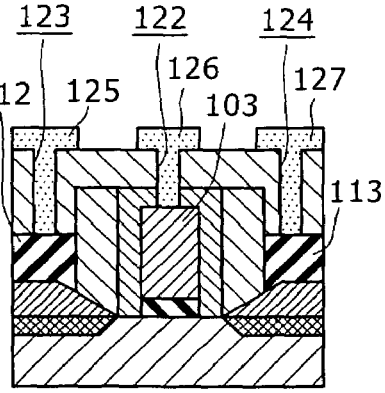

Next, as shown in FIG. 4H, a wiring (or a lead-out electrode) 126 connected to the gate electrode 103 through the contact hole 122 and wirings (or lead-out wirings) 125, 127 connected respectively to the source/drain regions 112, 113 through the contact holes 123, 124 are formed.

The method of manufacturing a semiconductor device according to the another embodiment of the present invention includes the step of forming the first epitaxial layer 107, 108 so as to fill up the portions, cut out at the time of forming the side wall spacer 104, of the semiconductor substrate 101, i.e., the recesses 105, 106 in the semiconductor substrate 101, whereby the cut-out portions of the semiconductor substrate 101 are filled up. Accordingly, when the first epitaxial layer 107, 108 is formed to have an impurity concentration comparable to that of the semiconductor substrate 101, the semiconductor substrate 101 can be substantially restored into the state before being cut out. Besides, the manufacturing method includes the step of forming the extension regions 109, 110 composed of the second epitaxial layer of a conduction type opposite to that of the first epitaxial layer 107, 108, on the first epitaxial layer 107, 108, so that the extension regions 109, 110 can be formed to be flush with or above the surface of the semiconductor substrate 101, whereby the short channel effect can be restrained.

In addition, since the recesses 105, 106 in the semiconductor substrate 101 are tapered at the time of processing the side wall spacer 104, the epitaxial growth of the first epitaxial layer 107, 108 is conducted according to the taper angle. This reduces the junction resistance between a channel portion beneath the gate electrode 103 and the extension regions 109, 110, so that the gate current (Ion) can be increased.

Besides, a liquid chemical treatment for adjusting the taper angle of the recesses 105, 106 in the semiconductor substrate 101 to the substrate orientation (e.g., crystal orientation) of the semiconductor substrate 101 is preferably conducted as a pretreatment, before the formation of the first epitaxial layer 107, 108. With the taper angle of the recesses 105, 106 in the semiconductor substrate 101 thus adjusted to the substrate orientation (e.g., crystal orientation) of the semiconductor substrate 101, junction accompanied by few defects can be realized, the junction resistance between the channel portion and the extension regions 109, 110 can be reduced, and the gate current (Ion) can be increased.

Further, in the epitaxial growth for forming the first epitaxial layer 107, 108 and that for forming the extension regions 109, 110, the angle of the epitaxially grown layer can be controlled. For example, raising the film forming temperature decreases (moderates) the taper angle of the epitaxially grown layer, and an increase in the flow rate of hydrogen chloride also decreases (moderates) the taper angle of the epitaxial layer. The epitaxially grown layer is formed under film forming conditions wherein dichlorosilane ($Si_2H_2Cl_2$) [supplied at a flow rate of 50 cm$^3$/min, for example], hydrogen chloride (HCl) [supplied at a flow rate of 15 to 60 cm$^3$/min, for example] and hydrogen ($H_2$) [supplied at a flow rate of 2 dm$^3$/min, for example] are used as raw material gases and the film forming temperature is set in the range of 750 to 850° C. Dichlorosilane may be replaced by monosilane; in that case, the flow rates of the gases supplied are modified as required, but the control of the taper angle can be achieved by regulating the film forming temperature and/or the hydrogen chloride flow rate, similarly to the above.

The semiconductor device and the method of manufacturing a semiconductor device according to embodiments of the present invention are preferable for application to semiconductor devices including elevated source/drain regions, particularly MOS type transistors, and to manufacturing methods thereof.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising, as viewed in cross section:
    a substrate;
    a gate insulating film formed on an upper surface of the substrate;
    a gate electrode formed on the gate insulation film;
    side wall spacers formed on oppositely facing side walls of said gate electrode;
    recesses formed in said substrate below said upper surface of the substrate with said gate electrode therebetween;
    first epitaxial layers formed in said recesses below said upper surface of the substrate;

extension layers formed on said first epitaxial layers above said upper surface of said substrate and having slant regions between at least said first epitaxial layers and said side wall spacers;

source/drain layers formed on said extension layers; and sidewall films between the sidewall spacers and the source/drain layers, wherein, said extension layers comprise second epitaxial layers which have a conductivity type opposite that of the conductivity type of said first epitaxial layers, said slant regions of said extension layers diminish in thickness in proximity of said gate electrode so as to reduce an electrical coupling capacity with said gate electrode, and first epitaxial layers and said extensions are positioned laterally outside of said gate electrode, said gate insulation film and said sidewall spacers.

2. The semiconductor device as set forth in claim 1, wherein said first epitaxial layers have an impurity concentration equal to the impurity concentration of said semiconductor substrate.

3. The semiconductor device as set forth in claim 1, wherein said extension layers decrease film thickness in a direction toward said gate electrode.

4. The semiconductor device as set forth in claim 1, wherein:

said first epitaxial layers are doped with an impurity in an impurity concentration equal to the impurity concentration of said semiconductor substrate by in-situ doping at the time of epitaxial growth thereof; and said second epitaxial layers are doped with an impurity in an impurity concentration for said extension layers by in-situ doping at the time of epitaxial growth thereof.

* * * * *